(12) United States Patent
Sakai et al.

(10) Patent No.: US 12,543,273 B2
(45) Date of Patent: Feb. 3, 2026

(54) PRINTED WIRING BOARD

(71) Applicant: IBIDEN CO., LTD., Gifu (JP)

(72) Inventors: Jun Sakai, Ogaki (JP); Takuya Inishi, Ogaki (JP); Susumu Kagohashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 196 days.

(21) Appl. No.: 18/475,276

(22) Filed: Sep. 27, 2023

(65) Prior Publication Data

US 2024/0107684 A1   Mar. 28, 2024

(30) Foreign Application Priority Data

Sep. 28, 2022   (JP) ................................. 2022-154723
May 18, 2023   (JP) ................................. 2023-082142

(51) Int. Cl.
| | |
|---|---|
| *H05K 1/11* | (2006.01) |
| *H05K 3/16* | (2006.01) |
| *H05K 3/46* | (2006.01) |

(52) U.S. Cl.
CPC ........... *H05K 3/4608* (2013.01); *H05K 1/115* (2013.01); *H05K 3/16* (2013.01); *H05K 2201/0209* (2013.01); *H05K 2201/0212* (2013.01); *H05K 2201/095* (2013.01)

(58) Field of Classification Search
CPC .......... H05K 1/11; H05K 1/111; H05K 1/115; H05K 1/116; H05K 1/0373; H05K 3/4608; H05K 3/16; H05K 3/421; H05K 2201/0209; H05K 2201/0212; H05K 2201/095

See application file for complete search history.

(56) References Cited

U.S. PATENT DOCUMENTS

| | | | |
|---|---|---|---|
| 9,516,764 B2 * | 12/2016 | Yoshida | ............... H05K 1/0346 |
| 2022/0071016 A1 | 3/2022 | Hwang et al. | |
| 2024/0147617 A1 * | 5/2024 | Nirengi | .................... H05K 3/46 |

FOREIGN PATENT DOCUMENTS

JP     2000-124602 A     4/2000

* cited by examiner

*Primary Examiner* — Roshn K Varghese
(74) *Attorney, Agent, or Firm* — Finnegan, Henderson, Farabow, Garrett & Dunner, LLP

(57) ABSTRACT

A printed wiring board includes a first conductor layer, a resin insulating layer having an opening, a second conductor layer including a seed layer and an electrolytic plating layer formed on the seed layer, and a via conductor including the seed and electrolytic plating layers and connecting the first and second conductor layers. The seed layer has a first portion on the surface of the insulating layer, a second portion on an inner wall surface in the opening of the insulating layer, and a third portion on a portion of the first conductor layer exposed by the opening of the insulating layer such that the first portion is thicker than the second and third portions, and the insulating layer includes resin and inorganic particles including first particles forming the inner wall surface and second particles embedded in the insulating layer and having shapes different from shapes of the first particles.

20 Claims, 6 Drawing Sheets

PRINTED WIRING BOARD

CROSS-REFERENCE TO RELATED APPLICATIONS

The present application is based upon and claims the benefit of priority to Japanese Patent Application No. 2022-154723, filed Sep. 28, 2022, and to Japanese Patent Application No. 2023-082142, filed May 18, 2023. The entire contents of these applications are incorporated herein by reference.

BACKGROUND OF THE INVENTION

Field of the Invention

The present invention relates to a printed wiring board and a method of manufacturing a printed wiring board.

Description of Background Art

Japanese Patent Application Laid-Open Publication No. 2000-124602 describes a printed wiring board having a resin substrate, a resin insulating layer formed on the resin substrate, and a conductor circuit. The entire contents of this publication are incorporated herein by reference.

SUMMARY OF THE INVENTION

According to one aspect of the present invention, a printed wiring board includes a first conductor layer, a resin insulating layer formed on the first conductor layer having an opening, a second conductor layer formed on a surface of the resin insulating layer and including a seed layer and an electrolytic plating layer formed on the seed layer, and a via conductor formed in the opening of the resin insulating layer and including the seed layer and the electrolytic plating layer formed on the seed layer such that the via conductor is connecting the first conductor layer and the second conductor layer. The seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and a thickness of the third portion, and the resin insulating layer includes resin and inorganic particles such that the inorganic particles including first inorganic particles forming the inner wall surface and second inorganic particles embedded in the resin insulating layer and that the first inorganic particles have shapes that are different from shapes of the second inorganic particles.

According to another aspect of the present invention, a method for manufacturing a printed wiring board includes forming an opening in a resin insulating layer formed on a first conductor layer such that the opening exposes a portion of the first conductor layer, forming, on a surface of the resin insulating layer, a second conductor layer including a seed layer and an electrolytic plating layer formed on the seed layer, and forming, in the opening of the resin insulating layer, a via conductor including the seed layer and the electrolytic plating layer formed on the seed layer such that the via conductor is connecting the first conductor layer and the second conductor layer. The seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and a thickness of the third portion, the resin insulating layer includes resin and inorganic particles such that the inorganic particles including first inorganic particles forming the inner wall surface and second inorganic particles embedded in the resin insulating layer and that the first inorganic particles have shapes that are different from shapes of the second inorganic particles, and the forming of the opening includes forming a group of the second inorganic particles having protruding portions protruding from the inner wall surface in the opening of the resin insulating layer, and removing the protruding portions in the group of the second inorganic particles such that exposed surfaces of the first inorganic particles are formed on the inner wall surface of the resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
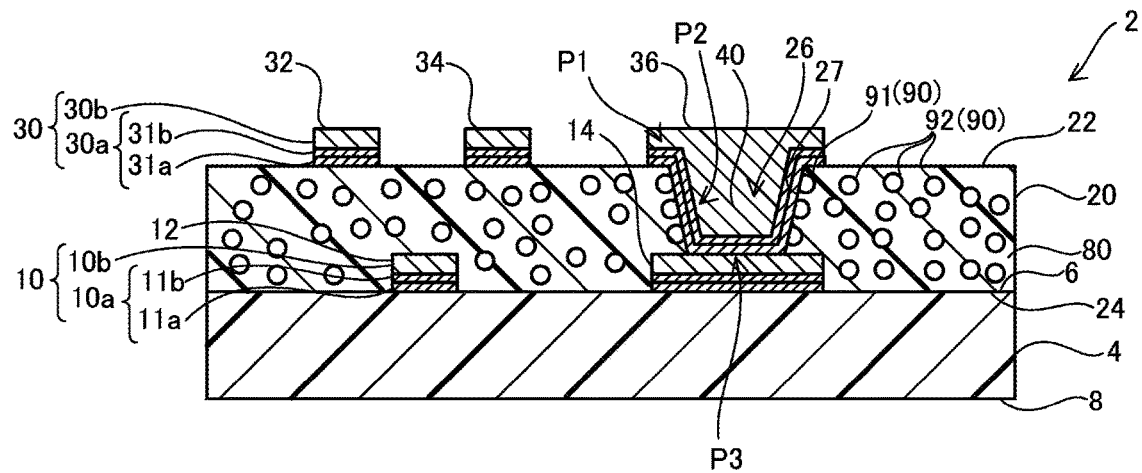
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2:
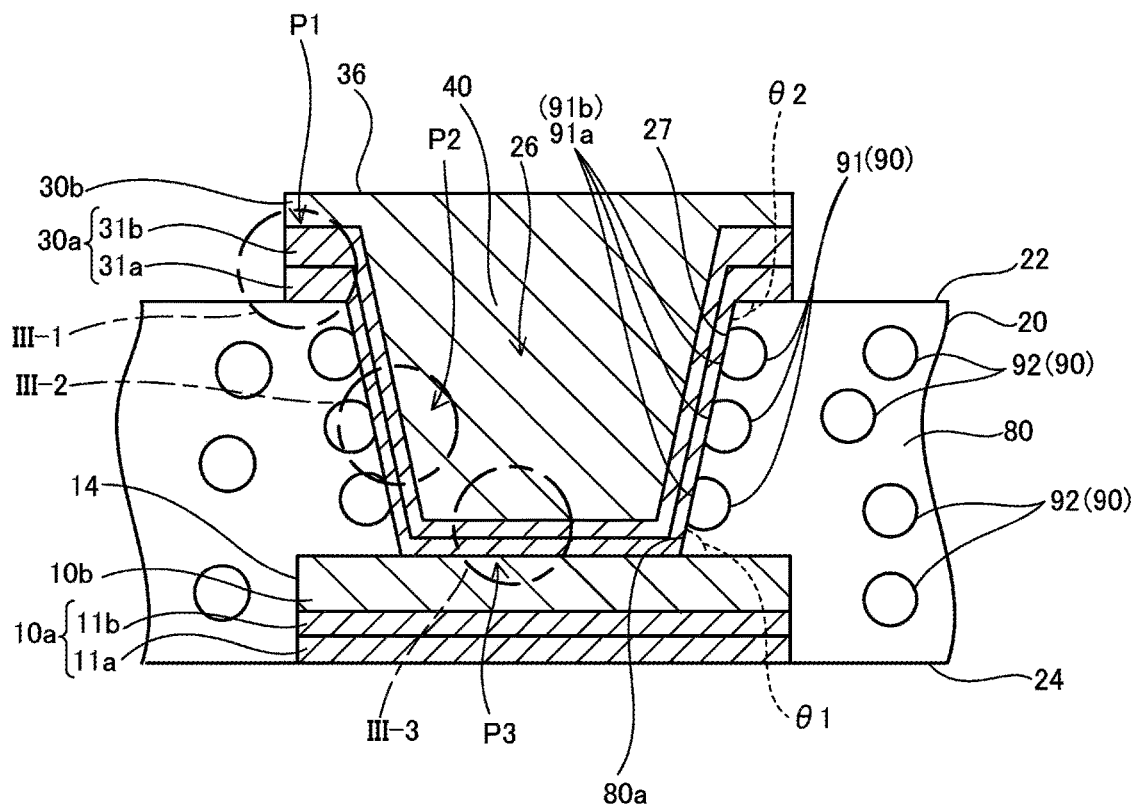
FIG. 2 is an enlarged cross-sectional view schematically illustrating a part of a printed wiring board according to an embodiment of the present invention.

FIG. 1 is a cross-sectional view illustrating a printed wiring board 2 according to an embodiment of the present invention. FIG. 2 is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles. The insulating layer 4 may contain a reinforcing material such as a glass cloth. The insulating layer 4 has a third surface 6 and a fourth surface 8 on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed of a first layer (11a) on the third surface 6 and a second layer (11b) on the first layer (11a). The first layer (11a) is formed of a copper alloy. The copper alloy has a copper content (wt %) of 90% or more. The second layer (11b) is formed of copper. The electrolytic plating layer (10b) is formed of copper. The first layer (11a) is in contact with the insulating layer 4.

The resin insulating layer 20 is formed on the third surface 6 of the insulating layer 4 and on the first conductor layer 10. The resin insulating layer 20 has a first surface 22 and a second surface 24 on the opposite side with respect to the first surface 22. The second surface 24 of the resin insulating layer 20 faces the first conductor layer 10. The resin insulating layer 20 has an opening 26 that exposes the pad 14. The resin insulating layer 20 is formed of a resin 80 and a large number of inorganic particles 90 dispersed in the resin 80. The resin 80 is an epoxy resin. Examples of the resin include a thermosetting resin and a photocurable resin. Examples of the inorganic particles 90 include silica particles and alumina particles. The material of the insulating layer 4 and the material of the resin insulating layer 20 are preferably the same.

As illustrated in FIGS. 1 and 2, the inorganic particles 90 include first inorganic particles 91 forming an inner wall surface 27 of the opening 26 and second inorganic particles 92 embedded in the resin 80. The second inorganic particles 92 each have a spherical shape. The first inorganic particles 91 each have a shape obtained by cutting a sphere with a plane. The first inorganic particles 91 each have a shape obtained by cutting a second inorganic particle 92 with a plane. The first inorganic particles 91 and the second inorganic particles 92 are different in shape.

As illustrated in FIG. 1, the first surface 22 of the resin insulating layer 20 is substantially formed of the resin 80 only. Substantially no inorganic particles 90 (second inorganic particles 92) are exposed from the first surface 22. The first surface 22 substantially includes no surfaces of the second inorganic particles 92. Substantially no unevenness is formed on the first surface 22 of the resin insulating layer 20. The first surface 22 is not roughened. The first surface 22 is formed substantially smooth.

As illustrated in FIG. 2, the inner wall surface 27 of the opening 26 is formed of the resin 80 and the first inorganic particles 91. The first inorganic particles 91 each have a flat part (91a). The flat parts (91a) form the inner wall surface 27. The inner wall surface 27 is formed of the resin 80 and the flat parts (91a). The flat parts (91a) and a surface of the resin 80 that forms the inner wall surface 27 form substantially a common surface. No unevenness is formed on the resin 80 that forms the inner wall surface 27. The surface of the resin 80 that forms the inner wall surface 27 is smooth. No unevenness is formed on exposed surfaces (91b) of the flat parts (91a) (surfaces that form the inner wall surface 27). The exposed surfaces (91b) of the flat parts (91a) are smooth. The inner wall surface 27 is formed smooth. The inner wall surface 27 has an arithmetic mean roughness (Ra) of 1.0 μm or less.

The flat parts (91a) of the first inorganic particles 91 substantially match a surface obtained by extending a surface (80a) of the resin 80 formed around the first inorganic particles 91 (a surface that forms the inner wall surface 27). The flat parts (91a) drawn with substantially straight lines in FIGS. 1 and 2 each mean a flat surface. In the cross sections illustrated in FIGS. 1 and 2, the flat parts (91a) are each a flat surface. It is also possible that the flat parts (91a) are not each a perfect flat surface. The flat parts (91a) are each substantially a flat surface and are each substantially a smooth surface.

As illustrated in FIG. 2, the inner wall surface 27 of the opening 26 is inclined. An angle (inclination angle) (θ1) between an upper surface of the pad 14 and the inner wall surface 27 is 70 degrees or more and 85 degrees or less. The upper surface of pad 14 is included in an upper surface of first conductor layer 10. An angle (inclination angle) (θ2) between the first surface 22 of the resin insulating layer 20 and the inner wall surface 27 is 95 degrees or more and 110 degrees or less.

In the cross-sections illustrated in FIGS. 1 and 2, the opening 26 is illustrated to have a substantially inverted trapezoidal shape. However, the opening 26 has actually a substantially inverted truncated cone shape. Therefore, the inner wall surface (side wall) 27 of the opening 26 is actually a substantially curved surface. That is, the common surface formed by the flat parts (91a) and the resin 80 includes the inner wall surface (side wall) 27 formed as a substantially curved surface.

As illustrated in FIG. 1, the second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating layer (30*b*) on the seed layer (30*a*). The seed layer (30*a*) is formed of a first layer (31*a*) on the first surface 22 and a second layer (31*b*) on the first layer (31*a*). The first layer (31*a*) is formed of a copper alloy. The second layer (31*b*) is formed of copper. The electrolytic plating layer (30*b*) is formed of copper. The first layer (31*a*) is in contact with the first surface 22.

The first layer (31*a*) is formed of a copper alloy, the second layer (31*b*) is formed of copper, and the electrolytic plating layer (30*b*) is formed of copper. In this case, an amount of copper in the first layer (31*a*) is less than an amount of copper in the second layer (31*b*) and an amount of copper in the electrolytic plating layer (30*b*). The amount of copper in the second layer (31*b*) and the amount of copper in the electrolytic plating layer (30*b*) are each 99.9 at % or more. The amount of copper in the second layer (31*b*) and the amount of copper in the electrolytic plating layer (30*b*) are each preferably 99.95 at % or more.

The via conductor 40 is formed in the opening 26. The via conductor 40 connects the first conductor layer 10 and the second conductor layer 30. In FIG. 1, the via conductor connects the pad 14 and the land 36. The via conductor 40 is formed of a seed layer (30*a*) and an electrolytic plating layer (30*b*) on the seed layer (30*a*). The seed layer (30*a*) forming the via conductor 40 and the seed layer (30*a*) forming the second conductor layer are common. The seed layer (30*a*) forming the via conductor 40 is formed of a first layer (31*a*) covering an inner wall surface 27 of the opening 26 and an upper surface of the pad 14 exposed from the opening 26, and a second layer (31*b*) on the first layer (31*a*). The first layer (31*a*) is in contact with the upper surface of the pad 14 and the inner wall surface 27.

Figure 3A:
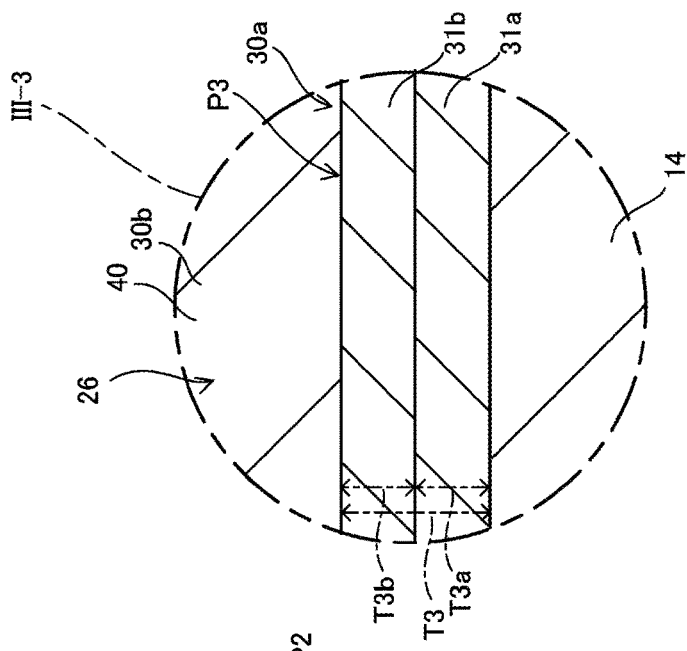
FIGS. 3A-3C are each an enlarged cross-sectional view schematically illustrating a part of a seed layer.
Figure 3B:
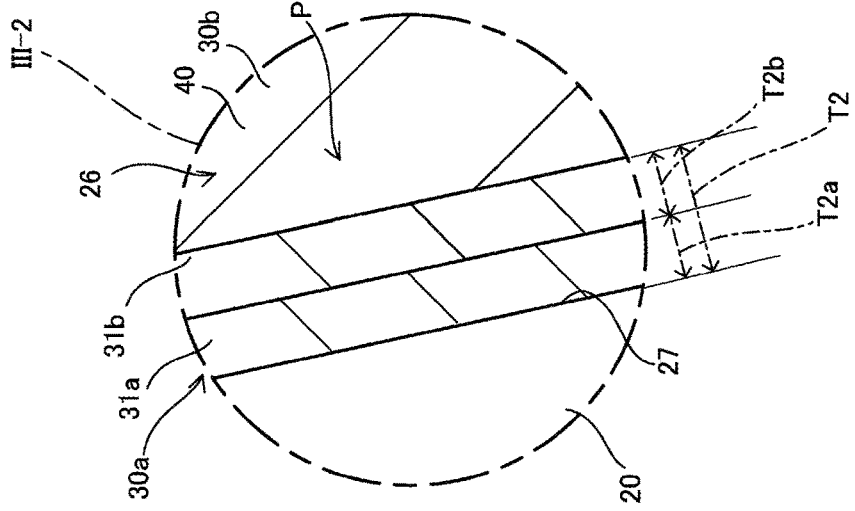
Figure 3C:
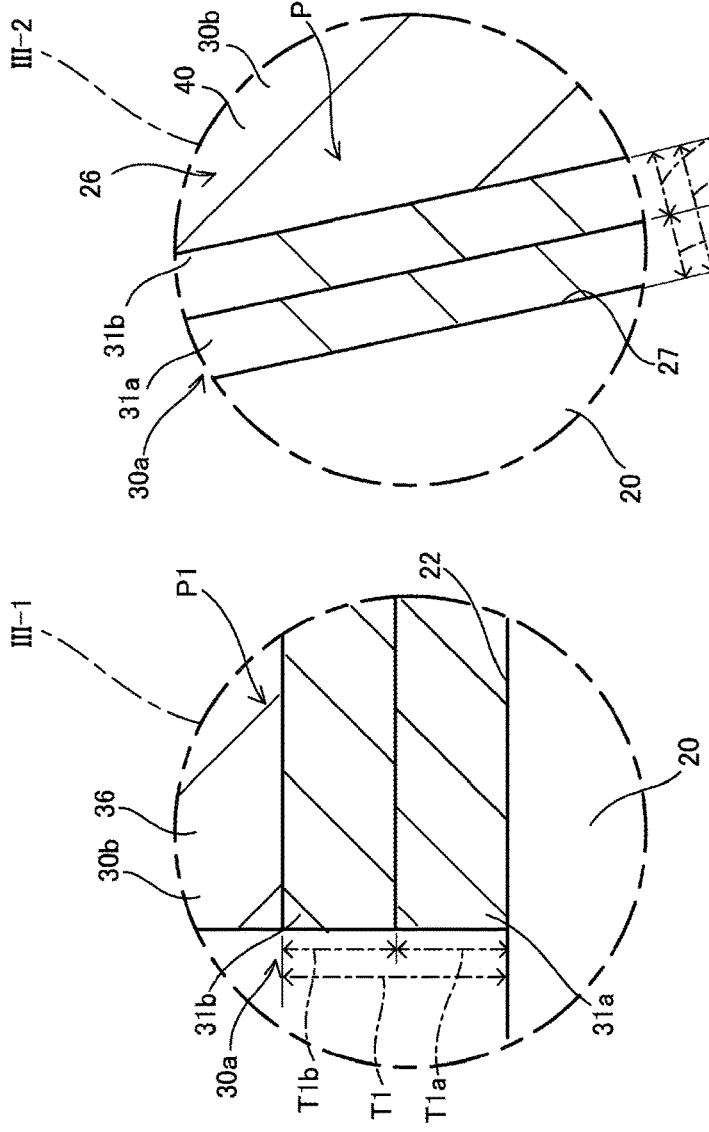

The seed layer (30*a*) has a first portion (P1) on the first surface 22, a second portion (P2) on the inner wall surface 27 of the opening 26, and a third portion (P3) on the pad 14 exposed from the opening 26. FIGS. 3A-3C are each an enlarged cross-sectional view illustrating a part of the seed layer (30*a*). FIG. 3A illustrates a portion (the first portion (P1)) indicated by a symbol (III-1) in FIG. 2. FIG. 3B illustrates a portion (the second portion (P2)) indicated by a symbol (III-2) in FIG. 2. FIG. 3C illustrates a portion (the third portion (P3)) indicated by a symbol (III-3) in FIG. 2. As illustrated in FIGS. 3A-3C, a thickness (T1) of the first portion (P1) is larger than a thickness (T2) of the second portion (P2) and a thickness (T3) of the third portion (P3). Further, the thickness (T3) of the third portion (P3) is larger than the thickness (T2) of the second portion (P2).

When the seed layer (30*a*) is formed of multiple layers, the thickness (T1), the thickness (T2) and the thickness (T3) are each a total thickness of the layers.

A thickness (T1*a*) of the first portion (P1) of the first layer (31*a*) is larger than a thickness (T2*a*) of the second portion (P2) of the first layer (31*a*) and a thickness (T3*a*) of the third portion (P3) of the first layer (31*a*). Further, the thickness (T3*a*) of the third portion (P3) of the first layer (31*a*) is larger than the thickness (T2*a*) of the second portion (P2) of the first layer (31*a*).

Thicknesses of the other layers have similar relationships to those of the thicknesses of the first layer (31*a*). Therefore, when the seed layer (30*a*) is formed of two layers, a thickness (T1*b*) of the first portion (P1) of the second layer (31*b*) is larger than a thickness (T2*b*) of the second portion (P2) of the second layer (31*b*) and a thickness (T3*b*) of the third portion (P3) of the second layer (31*b*). Further, the thickness (T3*b*) of the third portion (P3) of the second layer (31*b*) is larger than the thickness (T2*b*) of the second portion (P2) of the second layer (31*b*).

A ratio of the thickness (T2) of the second portion (P2) to the thickness (T1) of the first portion (P1) ((the thickness (T2) of the second portion (P2))/(the thickness (T1) of the first portion (P1))) is 0.2 or more and 0.6 or less. A ratio of the thickness (T3) of the third portion (P3) to the thickness (T1) of the first portion (P1) ((the thickness (T3) of the third portion (P3))/(the thickness (T1) of the first portion (P1))) is 0.5 or more and 0.9 or less.

A thickness of the second layer (31*b*) is larger than a thickness of the first layer (31*a*). The thickness (T1*b*) is larger than the thickness (T1*a*). The thickness (T2*b*) is larger than the thickness (T2*a*). The thickness (T3*b*) is larger than the thickness (T3*a*).

When the seed layer (30*a*) is formed of only the first layer (31*a*), the thickness (T1*a*) of the first portion (P1) of the first layer (31*a*) is larger than the thickness (T2*a*) of the second portion (P2) of the first layer (31*a*) and the thickness (T3*a*) of the third portion (P3) of the first layer (31*a*). Further, the thickness (T3*a*) of the third portion (P3) of the first layer (31*a*) is larger than the thickness (T2*a*) of the second portion (P2) of the first layer (31*a*).

The thickness (T1) of the first portion (P1) of the seed layer (30*a*) is 0.02 μm or more and 1.0 μm or less. The thickness (T1*a*) of the first portion (P1) of the first layer (31*a*) is 0.01 μm or more and 0.5 μm or less. The thickness (T1*b*) of the first portion (P1) of the second layer (31*b*) is 0.01 μm or more and 0.9 μm or less. When the thickness (T1) of the first portion (P1) of the seed layer (30*a*) is less than 0.02 for example, adhesion strength between the resin insulating layer 20 and the seed layer (30*a*) is low. When the thickness (T1) of the first portion (P1) exceeds 1.0 since an etching amount of the seed layer (30*a*) increases, it becomes difficult to control a wiring width.

The thickness (T2) of the second portion (P2) of the seed layer (30*a*) on the inner wall surface 27 of the opening 26 is 0.004 μm or more and 0.6 μm or less. The thickness (T2*a*) of the second portion (P2) of the first layer (31*a*) is 0.002 μm or more and 0.3 μm or less. The thickness (T2*b*) of the second portion (P2) of the second layer (31*b*) is 0.002 μm or more and 0.54 μm or less.

The thickness (T3) of the third portion (P3) of the seed layer (30*a*) on the pad 14 exposed from the opening 26 is 0.01 μm or more and 0.9 μm or less. The thickness (T3*a*) of the third portion (P3) of the first layer (31*a*) is 0.005 μm or more and 0.45 μm or less. The thickness (T3*b*) of the third portion (P3) of the second layer (31*b*) is 0.005 μm or more and 0.81 μm or less. The third portion (P3) is a connecting portion between the via conductor 40 and the pad 14.

Method for Manufacturing Printed Wiring Board

Figure 4A:
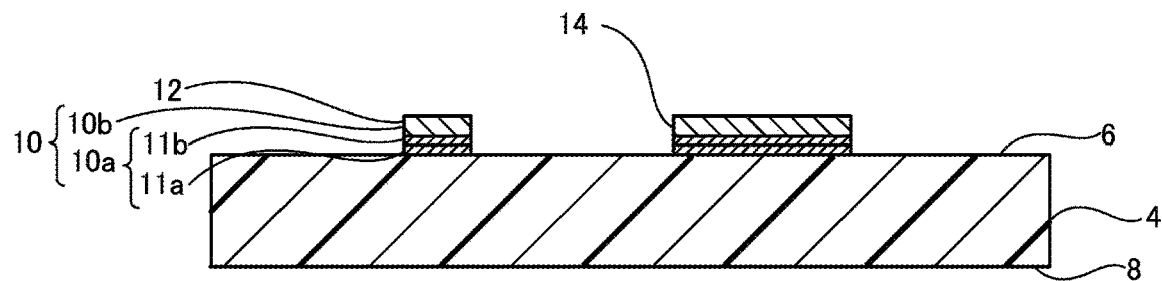
FIG. 4A is a cross-sectional view schematically illustrating a method for manufacturing a printed wiring board according to an embodiment of the present invention.
Figure 4B:
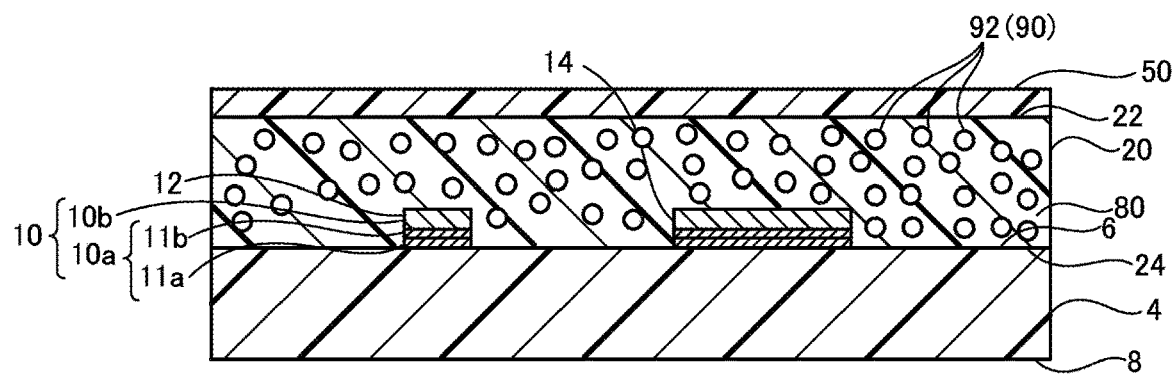
FIG. 4B is a cross-sectional view schematically illustrating a method for manufacturing a printed wiring board according to an embodiment of the present invention.
Figure 4C:
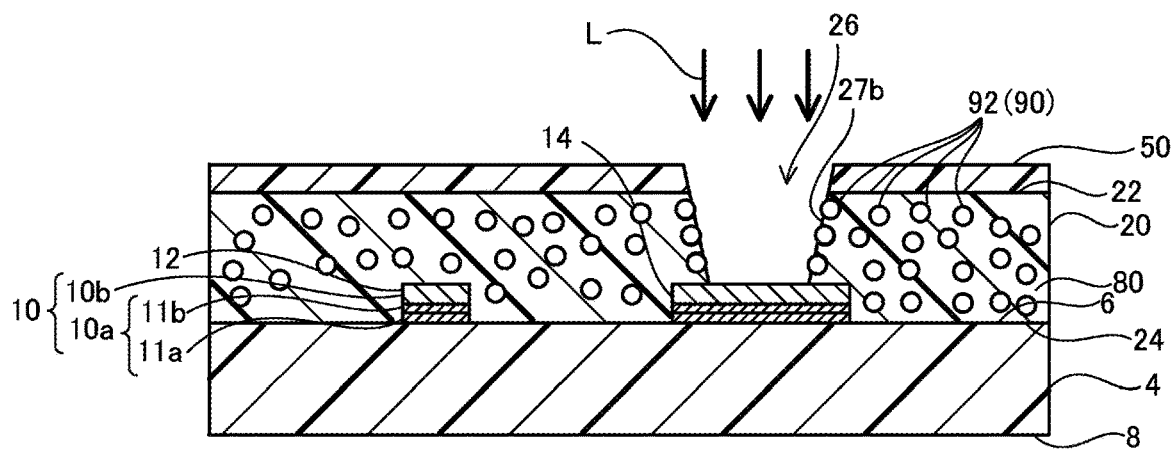
FIG. 4C is a cross-sectional view schematically illustrating a method for manufacturing a printed wiring board according to an embodiment of the present invention.
Figure 4D:
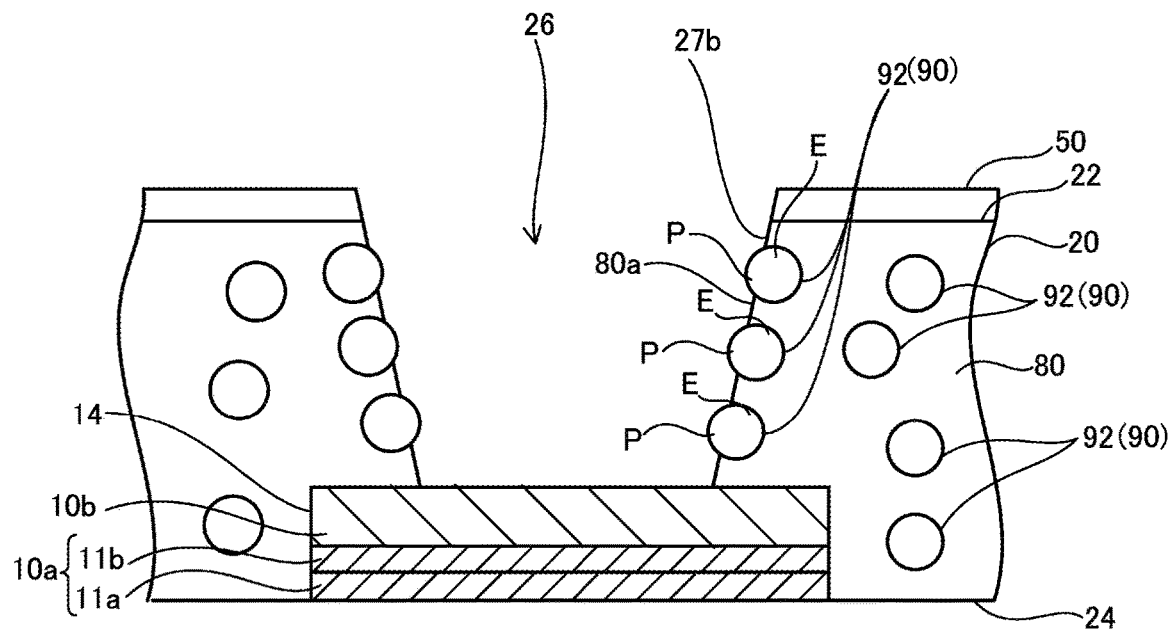
FIG. 4D is an enlarged cross-sectional view schematically illustrating a method for manufacturing a printed wiring board according to an embodiment of the present invention.

FIGS. 4A-4H illustrate a method for manufacturing the printed wiring board 2 according to an embodiment of the present invention. FIGS. 4A-4C and 4E-4H are cross-sectional views. FIG. 4D is an enlarged cross-sectional view. FIG. 4A illustrates the insulating layer 4 and the first conductor layer 10 formed on the third surface 6 of the insulating layer 4. The first conductor layer 10 is formed using a semi-additive method. The first layer (11*a*) and second layer (11*b*) are formed by sputtering. The electrolytic plating layer (10*b*) is formed by electrolytic plating.

As illustrated in FIG. 4B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20. The resin insulating layer 20 has the resin 80 and the inorganic particles 90 (the second inorganic particles 92). The inorganic particles 90 are embedded in the resin 80.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

As illustrated in FIG. 4C, laser (L) is irradiated from above the protective film 50. The laser (L) penetrates the protective film 50 and the resin insulating layer 20 at the same time. The opening 26 for a via conductor reaching the pad 14 of the first conductor layer is formed. The laser (L) is, for example, UV laser, or CO2 laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 4D illustrates an inner wall surface (27b) of the opening 26 after the laser irradiation. The inner wall surface (27b) is formed of the resin 80 and the inorganic particles 90 protruding from the resin 80. In order to control a shape of the inner wall surface, the inner wall surface (27b) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (27b) after the laser irradiation with a chemical. Or the inorganic particles 90 protruding from the resin 80 are selectively removed by treating the inner wall surface (27b) after the laser irradiation with plasma. The selectively removing includes that an etching rate of the inorganic particles 90 is greater than an etching rate of the resin 80. For example, a difference in etching rate between the two is 10 or more times. Or the difference in etching rate between the two is 50 or more times. Or the difference in etching rate between the two is 100 or more times. By treating the inner wall surface (27b) after the laser irradiation, the first inorganic particles 91 having the flat parts (91a) (see FIG. 2) are obtained. By controlling conditions for treating the inner wall surface (27b) after the laser irradiation, the shape of the inner wall surface (27b) can be controlled. Examples of the conditions are a temperature, a concentration, a time, a type of gas, and a pressure. The etching rate of the inorganic particles 90 and the etching rate of the resin are controlled.

By irradiating the resin insulating layer 20 with the laser (L), some of the second inorganic particles 92 embedded in the resin 80 form the inner wall surface (27b) after the laser irradiation. The second inorganic particles 92 forming the inner wall surface (27b) after the laser irradiation are each formed of a protruding portion (P) protruding from the resin 80 and a portion (E) embedded in the resin 80. The inner wall surface (27b) after the laser irradiation is treated. For example, the inner wall surface (27b) is treated with plasma of a gas containing tetrafluoromethane. The protruding portions (P) are selectively removed to form the inner wall surface 27 (FIGS. 1 and 2) of the embodiment. The first inorganic particles 91 are formed from the second inorganic particles 92. By selectively removing the protruding portions (P), the first inorganic particles 91 having the flat parts (91a) are formed. The flat parts (91a) are flat surfaces. When the second inorganic particles 92 having spherical shapes are cut along a flat surface, the shapes of the first inorganic particles 91 are obtained. The inner wall surface 27 is formed of the flat parts (91a) and the surface (80a) of the resin 80, and the exposed surfaces (91b) of the flat parts (91a) and the surface (80a) of the resin 80 are substantially positioned on the same plane. For example, when the seed layer (30a) is formed on the inner wall surface (27b) by sputtering, the protruding portions (P) inhibit growth of a sputtering film (sputtering-deposited film). For example, a continuous seed layer (30a) is not formed on the inner wall surface (27b). Or the seed layer (30a) is increased in thickness. A fine conductor circuit cannot be formed. In the embodiment, the projecting portions (P) are removed. The seed layer (30a) formed by sputtering can be reduced in thickness. Even when the seed layer (30a) formed by sputtering is thin, a continuous seed layer (30a) can be obtained.

Forming the opening 26 includes forming the inorganic particles 90 (the second inorganic particles 92) having the protruding portions (P). The protruding portions (P) protrude from the resin 80 forming the inner wall surface 27 of the opening 26. The first inorganic particles 91 are formed by removing the protruding portions (P) of the inorganic particles 90 (the second inorganic particles 92). The inner wall surface 27 of the opening 26 includes the exposed surfaces (91b) of the first inorganic particles 91. The exposed surfaces (91b) of the first inorganic particles 91 are formed by removing the protruding portions (P).

Obtaining the shapes of the first inorganic particles 91 by cutting the second inorganic particles 92 having spherical shapes with a plane includes removing the protruding portions (P) of the inorganic particles 90. The inner wall surface 27 of the opening 26 is actually a substantially curved surface. Since the flat parts (91a) are formed by removing the protruding portions (P), the exposed surfaces (91b) of the flat parts (91a) each include a curved surface. That is, forming a common surface with the flat parts (91a) and the resin 80 includes forming the inner wall surface 27 formed with a substantially curved surface.

The inner wall surface 27 can have steps between the exposed surfaces (91b) of the first inorganic particles 91 and the surface (80a) of the resin 80 surrounding the first inorganic particles 91 that have the exposed surfaces (91b). The exposed surfaces (91b) are recessed from the surface (80a) of the resin 80. Or the exposed surfaces (91b) protrude from the surface (80a) of the resin 80. The steps (distances from the exposed surfaces (91b) to the surface (80a) of the resin 80) are 5 μm or less. The steps are preferably 3 μm or less. The steps are more preferably 1.5 μm or less. Even when the steps are formed, since the steps are small, the exposed surfaces (91b) and the surface (80a) of the resin 80 form a substantially common surface.

No unevenness is formed on the inner wall surface 27. The inner wall surface 27 is formed smooth. By controlling the conditions for treating the inner wall surface (27b) after the laser irradiation, a size of unevenness is controlled.

The inside of the opening 26 is cleaned. By cleaning the inside of the opening 26, resin residues generated when the opening 26 is formed are removed. The cleaning of the inside of the opening 26 is performed using plasma. That is, the cleaning is performed in a dry process. The cleaning includes a desmear treatment. The first surface 22 of the resin insulating layer 20 is covered by the protective film 50, and thus, is not affected by the plasma. No unevenness is formed on the first surface 22 of the resin insulating layer 20. The first surface 22 is not roughened.

When treating the inner wall surface (27b) after the laser irradiation includes cleaning the inside of the opening 26, cleaning the inside of the opening 26 can be omitted.

Figure 4E:
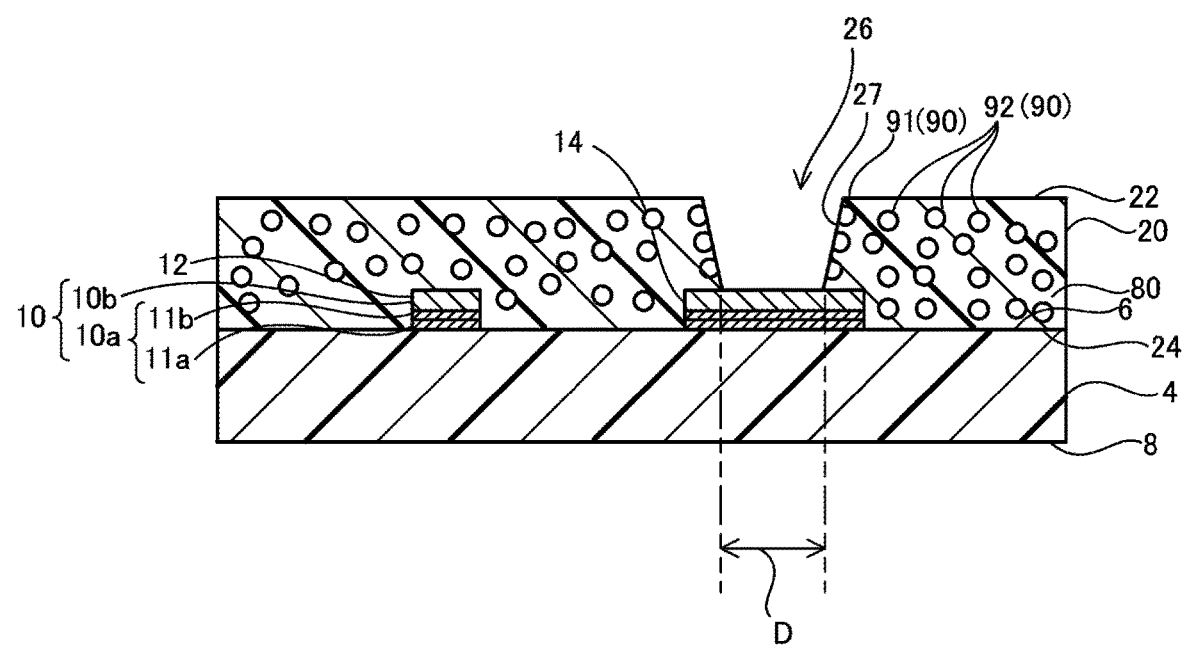
FIG. 4E is a cross-sectional view schematically illustrating the method for manufacturing a printed wiring board according to an embodiment of the present invention.

As illustrated in FIG. 4E, after cleaning the inside of the opening 26, the protective film 50 is removed from the resin insulating layer 20. When treating the inner wall surface (27b) after the laser irradiation includes cleaning the inside of the opening 26, the protective film 50 is removed from the resin insulating layer 20 after treating the inner wall surface (27b) after the laser irradiation. When the inner wall surface (27b) after the laser irradiation is treated, the protective film 50 covers the first surface 22 of the resin insulating layer 20. After the protective film 50 is removed, no roughening of the first surface 22 of the resin insulating layer 20 is performed.

Figure 4F:
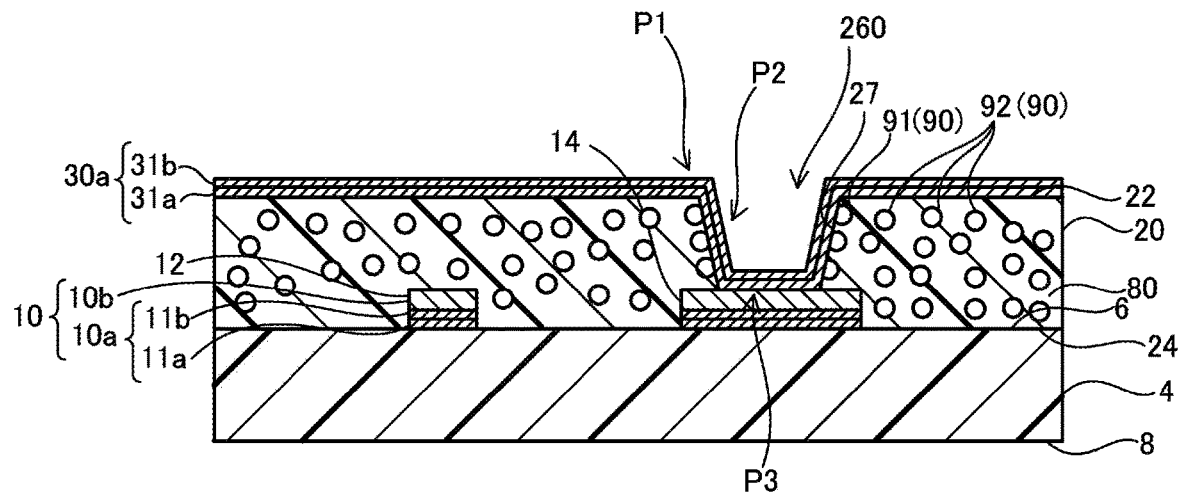
FIG. 4F is a cross-sectional view schematically illustrating a method for manufacturing a printed wiring board according to an embodiment of the present invention.

As illustrated in FIG. 4F, the seed layer (30a) is formed on the first surface 22 of the resin insulating layer 20. The seed layer (30a) is formed by sputtering. The formation of the seed layer (30a) is performed in a dry process. The first layer (31a) is formed on the first surface 22 by sputtering. At the same time, the first layer (31a) is formed on the inner wall surface 27 and the pad 14, which are exposed from the opening 26, by sputtering. After that, the second layer (31b) is formed on the first layer (31a) by sputtering. The seed layer (30a) is also formed on the upper surface of the pad 14 exposed from the opening 26 and on the inner wall surface 27 of the opening 26. The first layer (31a) is formed of a copper alloy. The second layer (31b) is formed of copper.

For example, sputtering is performed via a mask. First, a first mask covering the opening 26 for a via conductor is positioned on the resin insulating layer 20. The first mask exposes only the first surface 22 of the resin insulating layer 20. The first portion (P1) having the thickness (T1a) is formed on the first surface 22 of the resin insulating layer 20 via the first mask. The first mask is removed. A second mask exposing only the inner wall surface 27 of the opening 26 for a via conductor is positioned on the resin insulating layer 20. The second portion (P2) having the thickness (T2a) is formed on the inner wall surface 27 via the second mask. The second mask is removed. A third mask exposing only the pad 14 exposed from the opening 26 for a via conductor is positioned on the resin insulating layer 20. The third portion (P3) having the thickness (T3a) is formed on the pad 14 via the third mask. The third mask is removed. As a result, the first layer (31a) is formed on the first surface 22. The first layer (31a) is formed on the inner wall surface 27 and the pad 14, which are exposed from the opening 26. After that, the second layer (31b) is formed on the first layer (31a). A method for forming the first layer (31a) and a method for forming the second layer (31b) are the same.

Examples of conditions for forming the first layer (31a) and the second layer (31b) by sputtering are provided below. A distance between a target and a substrate surface is 50 mm or more and 250 mm or less. A voltage is 15 eV or more and 50 eV or less. A gas concentration is 0.1 Pa or more and 1.0 Pa or less. For example, by changing a processing time, the thickness (T1) of the first portion (P1) of the seed layer (30a), the thickness (T2) of the second portion (P2) of the seed layer (30a), and the thickness (T3) of the third portion (P3) of the seed layer (30a) can be adjusted. The thickness (T1a) of the first portion (P1) of the first layer (31a) is larger than the thickness (T2a) of the second portion (P2) of the first layer (31a) and the thickness (T3a) of the third portion (P3) of the first layer (31a). Further, the thickness (T3a) of the third portion (P3) of the first layer (31a) is larger than the thickness (T2a) of the second portion (P2) of the first layer (31a). The thickness (T1b) of the first portion (P1) of the second layer (31b) is larger than the thickness (T2b) of the second portion (P2) of the second layer (31b) and the thickness (T3b) of the third portion (P3) of the second layer (31b). Further, the thickness (T3b) of the third portion (P3) of the second layer (31b) is larger than the thickness (T2b) of the second portion (P2). As a result, the thickness (T1) of the first portion (P1) of the seed layer (30a) is larger than the thickness (T2) of the second portion (P2) and the thickness (T3) of the third portion (P3). The thickness (T3) of the third portion (P3) of the seed layer (30a) is larger than the thickness (T2) of the second portion (P2).

A ratio of the thickness of the second layer (31b) to the thickness of the first layer (31a) ((the thickness of the second layer (31b))/(the thickness of the first layer (31a))) is 1.2 or more and 2 or less. A ratio ((the thickness (T1b))/(the thickness (T1a))), a ratio ((the thickness (T2b))/(the thickness (T2a))), and a ratio ((the thickness (T3b))/(the thickness (T3a))) are 1.2 or more and 2 or less.

The first portion (P1) is formed on the first surface 22 of the resin insulating layer 20, and the second portion (P2) is formed on the inner wall surface 27 of the resin insulating layer 20. The first portion (P1) and the second portion (P2) are both formed on the resin insulating layer 20. The first portion (P1) forms the seed layer (30a) of the land 36, the first signal wiring 32, and the second signal wiring 34. The second portion (P2) forms the seed layer (30a) of the via conductor 40. A thermal expansion coefficient of the resin insulating layer 20 and a thermal expansion coefficient of the seed layer (30a) are different from each other. Therefore, it is thought that, when the printed wiring board 2 receives a thermal shock, a stress acts on the seed layer (30a). Normally, the first signal wiring 32 and the second signal wiring 34 include portions that are bent considerably longer than the via conductor 40. Therefore, large stresses are expected to concentrate in the bent portions in the first signal wiring 32 and the second signal wiring 34. In contrast, the via conductor 40 is short and formed substantially straight. Therefore, concentration of a stress is unlikely to occur in the via conductor 40. Therefore, in order to avoid breakage of the seed layer (30a) on the first surface 22 of the resin insulating layer 20, the thickness of the seed layer (30a) forming the first signal wiring 32 and the second signal wiring 34 is preferably large. In contrast, the thickness of the seed layer (30a) on the inner wall surface 27 forming the via conductor 40 may be small. Therefore, in the embodiment, the thickness (T1) is larger than the thickness (T2).

By reducing the thickness (T2) of the second portion (P2), the time required to form the seed layer (30a) can be shortened.

Figure 4G:
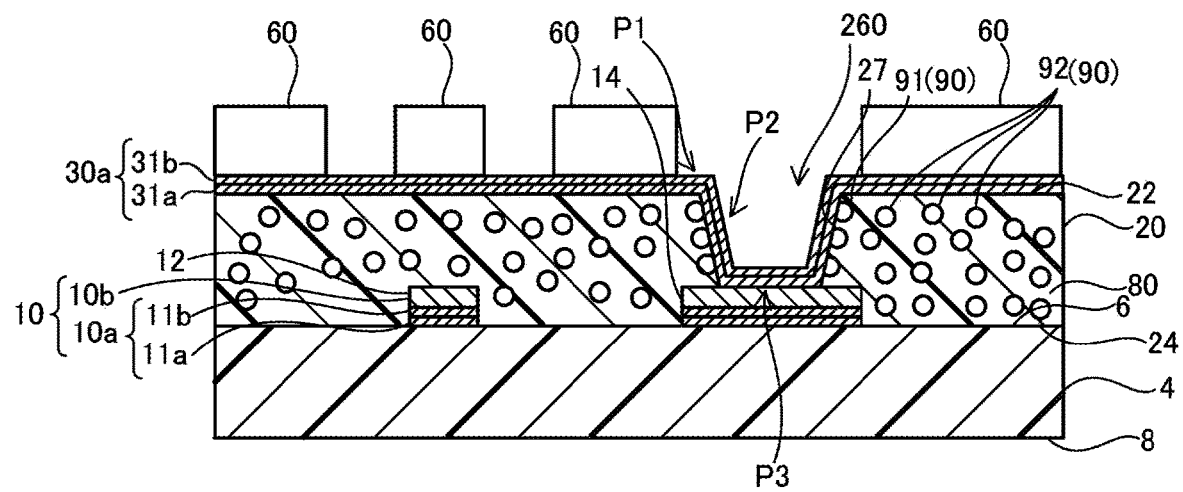
FIG. 4G is a cross-sectional view schematically illustrating a method for manufacturing a printed wiring board according to an embodiment of the present invention.

As illustrated in FIG. 4G, a plating resist 60 is formed on the seed layer (30a). The plating resist 60 has openings for forming the first signal wiring 32, the second signal wiring 34, and the land 36 (FIG. 1).

Figure 4H:
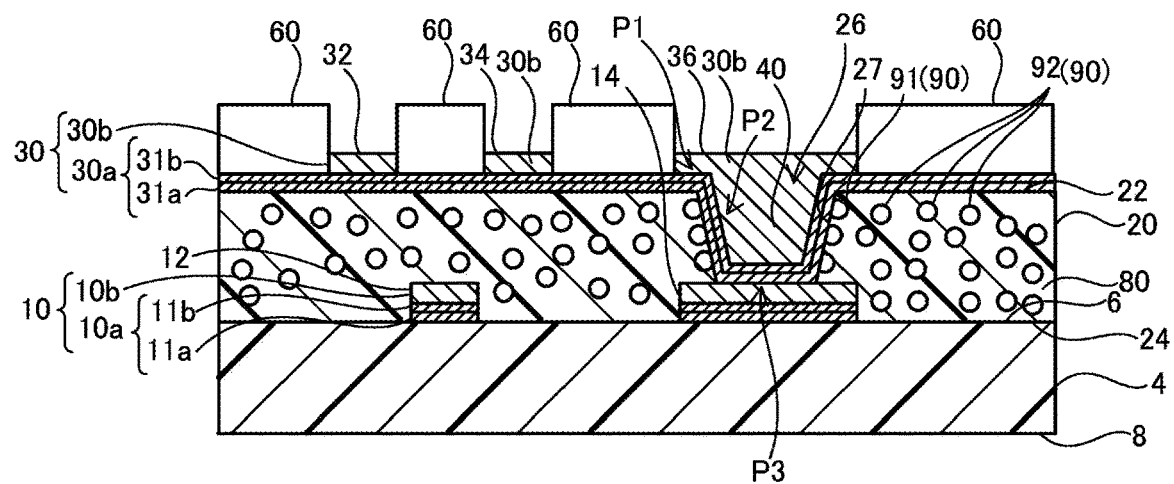
FIG. 4H is a cross-sectional view schematically illustrating a method for manufacturing a printed wiring board according to an embodiment of the present invention.

As illustrated in FIG. 4H, the electrolytic plating layer (30b) is formed on the seed layer (30a) exposed from the plating resist 60. The electrolytic plating layer (30b) is formed of copper. The electrolytic plating layer (30b) fills the opening 26. The first signal wiring 32, the second signal wiring 34, and the land 36 are formed by the seed layer (30a) and the electrolytic plating film (30b) on the first surface 22. The second conductor layer 30 is formed. The via conductor 40 is formed by the seed layer (30a) and the electrolytic plating film (30b) in the opening 26. The via conductor 40 connects the pad 14 and the land 36. The first signal wiring 32 and the second signal wiring 34 form a pair wiring.

An opening 260 for the via conductor 40 after the formation of the seed layer (30a) is illustrated in FIGS. 4F and 4G. When the thickness (T2) is small, a volume of the opening 260 for the via conductor 40 after the formation of the seed layer (30a) can be increased. Therefore, an electrolytic plating solution can easily enter the opening 260. A void is unlikely to form in the electrolytic plating layer (30b) that forms the via conductor 40. A via conductor 40 having a low resistance can be formed. Even when an opening diameter (D) of the opening 26 (a diameter on the pad 14) (see FIG. 4E) is 30 μm or less, a via conductor 40 that does not contain a void can be formed. Even when the opening diameter (D) is 10 μm or more and 25 μm or less, connection reliability via the via conductor 40 is stable for a long period of time. In this way, by reducing the thickness (T2) of the second portion (P2), cost, productivity and reliability can be improved. Therefore, the thickness (T2) is preferably smaller than thickness (T1).

The plating resist 60 is removed. The seed layer (30a) exposed from the electrolytic plating layer (30b) is removed. The second conductor layer 30 and the via conductor 40 are formed at the same time. The printed wiring board 2 (FIG. 1) of the embodiment is obtained.

The via conductor 40 is mainly formed of the electrolytic plating layer (30b), and the pad 14 is mainly formed of the electrolytic plating layer (10b). And the electrolytic plating layer (second electrolytic plating layer) (30b) that forms the via conductor 40 and the electrolytic plating layer (first electrolytic plating layer) (10b) that forms the pad 14 are connected via the seed layer (30a) formed by sputtering. In this way, the second electrolytic plating layer (30b) and the first electrolytic plating layer (10b) sandwich the seed layer (30a) formed by sputtering. The two (the second electrolytic plating layer (30b) and the first electrolytic plating layer (10b)) sandwich a film formed using a different manufacturing method from the two. Hypothetically, a film formed using a different manufacturing method is referred to as a heterogeneous film. An example of a heterogeneous film is a sputtering film. For example, when the printed wiring board 2 is subjected to heat cycles, it is thought that an amount of shrinkage of the two and an amount of shrinkage of the heterogeneous film are different. Therefore, connection reliability via the via conductor 40 is likely to decrease between the seed layer (30a) and the first electrolytic plating layer (10b). Or the connection reliability is likely to decrease between the seed layer (30a) and the second electrolytic plating layer (30b). However, in the embodiment, the two are connected via the third portion (P3) of the seed layer (30a). The thickness (T3) of the third portion (P3) is smaller than the thickness (T1) of the first portion (P1). A degree of influence of the heterogeneous film on the connection reliability can be reduced. The connection reliability via the via conductor 40 can be increased.

The first portion (P1) is formed on the first surface 22 of the resin insulating layer 20. Therefore, the seed layer (30a) forming the signal wirings (32, 34) is formed of the first portion (P1). A length (L1) of the first portion (P1), which forms the signal wirings (32, 34), is substantially the same as a length of the signal wirings (32, 34). Therefore, the length of the first portion (P1) forming the signal wirings (32, 34) is long. Since the second portion (P2) is formed on the inner wall surface (27) of the opening (26), a length of the second portion (P2) is substantially the same as a thickness of the resin insulating layer (20). Therefore, a length (L2) of the second portion (P2) forming the via conductor is short. A ratio (L1/L2) of the length (L1) to the length (L2) is roughly 100 or more. Normally, the signal wirings (32, 34) are not extended straight. An ordinary signal wiring is bent. When the printed wiring board 2 is subjected to heat cycles, it is thought that a stress concentrates in a bent portion. Since the length (L1) is large, it is thought that a stress acting on a bent portion is large. It is thought that a large stress acts on a bent portion in the first portion (P1). In contrast, the length (L2) is much shorter than the length (L1). And the second portion (P2) is formed on a substantially smooth surface formed by the exposed surfaces (91b) of the first inorganic particles 91 and the surface (80a) of the resin 80. Therefore, even when the printed wiring board 2 is subjected to heat cycles, it is thought that a stress will not concentrate at a specific point within the second portion (P2). From this point of view, even when the thickness (T2) of the second portion (P2) is smaller than the thickness (T1) of the first portion (P1), the seed layer (30a) of the second portion (P2) is unlikely to be damaged. Further, even when the seed layer (30a) of the second portion (P2) is thin, since the inner wall surface 27 is substantially smooth, a continuous seed layer (30a) can be formed on the inner wall surface 27 by sputtering.

According to the printed wiring board 2 (FIGS. 1 and 2) of the embodiment, the thick portion (first portion (P1)) of the seed layer (30a) is formed on the first surface 22 of the resin insulating layer 20. Therefore, adhesion strength between the second conductor layer 30 and the resin insulating layer 20 can be increased. A printed wiring board 2 with stable performance is provided.

In the printed wiring board 2 (FIGS. 1 and 2) of the embodiment, the inner wall surface 27 of the opening 26 is formed by the flat parts (91a) of the first inorganic particles 91 and the resin 80. The flat parts (93a) and the surface (80a) of the resin 80 forming the inner wall surface 27 form a substantially common surface. The inner wall surface 27 is formed smooth. Therefore, the seed layer (30a) having a uniform thickness is formed on the inner wall surface 27 of the opening 26. The seed layer (30a) is formed thin. When the seed layer (30a) is removed, an etching amount is small. Therefore, an etching amount of the electrolytic plating layer (30b) is small. The second conductor layer 30 having the first signal wiring 32 and the second signal wiring 34 has a width as designed. A high-quality printed wiring board 2 is provided.

In the printed wiring board 2 of the embodiment, the first surface 22 of the resin insulating layer 20 is substantially formed of the resin 80. Substantially no inorganic particles 90 are exposed on the first surface 22. Substantially no unevenness is formed on the first surface 22. An increase in standard deviation of a relative permittivity in a portion near the first surface 22 of the resin insulating layer 20 is suppressed. The relative permittivity of the first surface 22 does not significantly vary depending on a location. Even when the first signal wiring 32 and the second signal wiring 34 are in contact with the first surface 22, a difference in propagation speed of an electric signal between the first signal wiring 32 and the second signal wiring 34 can be reduced. Therefore, in the printed wiring board 2 of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. A high-quality printed wiring board 2 is provided.

First Alternative Example

In the first alternative example according to an embodiment of the present invention, the first layer (11a, 31a) of the seed layer (10*a*, 30*a*) is formed of any one metal of aluminum, titanium, nickel, chromium, calcium, magnesium, iron, molybdenum, and silver.

Second Alternative Example

Figure 5:
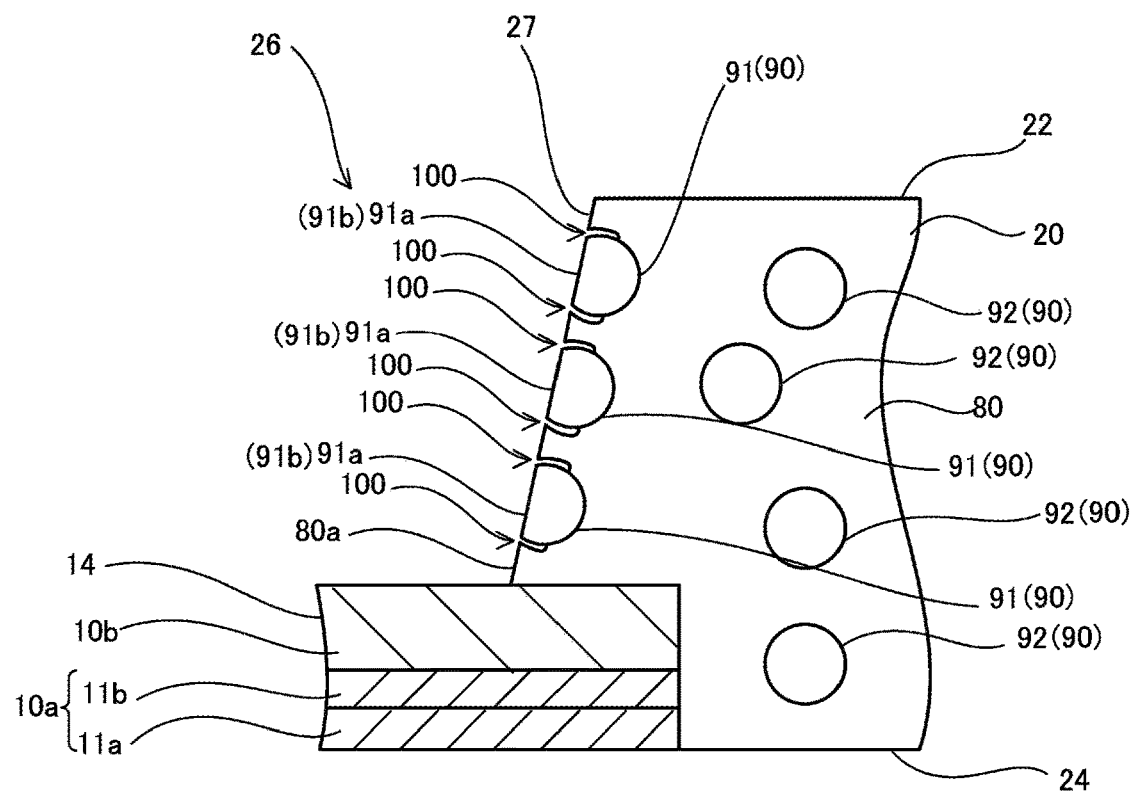
FIG. 5 is an enlarged cross-sectional view schematically illustrating a method for manufacturing a printed wiring board of the second alternative example of a printed wiring board according to an embodiment of the present invention.

In the second alternative example according to an embodiment of the present invention, the conditions for treating the inner wall surface (27*b*) after the laser irradiation are controlled. Therefore, as illustrated in FIG. 5, the flat parts (91*a*) and the surface (80*a*) of the resin 80 that forms the inner wall surface 27 form a substantially common surface. FIG. 5 is an enlarged cross-sectional view illustrating the inner wall surface 27 after the treatment. Distances between the exposed surfaces (91*b*) of the flat parts (91*a*) and the surface (80*a*) of the resin 80 are 5 µm or less. Therefore, even when there are gaps 100 between the first inorganic particles 91 and the resin 80 formed around the first inorganic particles 91, the seed layer (30*a*) can be formed in the gaps 100. In this case, the seed layer (30*a*) is formed on the inner wall surface 27 and in the gaps 100. When distances of the exposed surfaces (91*b*) of the flat parts (91*a*) from bottoms of the gaps 100 are 5 µm or less, the seed layer (30*a*) formed by sputtering is unlikely to peel off from the inner wall surface 27. The distances between the flat parts (91*a*) and the bottoms of the gaps 100 are preferably 3 µm or less. The distances between the exposed surfaces (91*b*) of the flat parts (91*a*) and the surface (80*a*) of the resin 80 are preferably 3 µm or less. The distances between the exposed surfaces (91*b*) of the flat parts (91*a*) and the surface (80*a*) of the resin 80 are equal to widths of the gaps 100. Variation in the thickness of the seed layer (30*a*) on the inner wall surface 27 can be reduced.

Japanese Patent Application Laid-Open Publication No. 2000-124602 describes a printed wiring board having a resin substrate, a resin insulating layer formed on the resin substrate, and a conductor circuit. The conductor circuit is formed on the resin insulating layer via an alloy layer containing a specific metal. For example, the specific metal is shown in Japanese Patent Application Laid-Open Publication No. 2000-124602.

In the printed wiring board having the alloy layer of Japanese Patent Application Laid-Open Publication No. 2000-124602, it is thought that adhesion between the conductor circuit and the resin insulating layer is insufficient.

A printed wiring board according to an embodiment of the present invention includes: a first conductor layer; a resin insulating layer that is formed on the first conductor layer, and has an opening for a via conductor exposing the first conductor layer, a first surface, and a second surface on the opposite side with respect to the first surface; a second conductor layer that is formed on the first surface of the resin insulating layer; and a via conductor that is formed in the opening and connects the first conductor layer and the second conductor layer. The second conductor layer and the via conductor are formed of a seed layer and an electrolytic plating layer formed on the seed layer. The seed layer has a first portion on the first surface, a second portion on an inner wall surface of the opening, and a third portion on the first conductor layer exposed from the opening, and the first portion is thicker than the second portion and the third portion. The resin insulating layer is formed of inorganic particles and a resin. The inorganic particles include first inorganic particles forming the inner wall surface and second inorganic particles embedded in the resin insulating layer, and shapes of the first inorganic particles are different from shapes of the second inorganic particles.

In a printed wiring board according to an embodiment of the present invention, a thick portion (the first portion) of the seed layer is formed on the first surface of the resin insulating layer. Therefore, adhesion strength between the second conductor layer and the resin insulating layer can be increased. A printed wiring board with stable performance is obtained. The second portion is thinner than the first portion. A volume of the opening for a via conductor after the formation of the seed layer can be increased. Even when a diameter of the opening for a via conductor is small, the opening for a via conductor can be filled with the electrolytic plating layer. The first conductor layer and the via conductor are connected via the third portion. The third portion is thinner than the first portion. Influence of the third portion can be reduced. Connection resistance via the third portion is unlikely to increase.

In a printed wiring board according to an embodiment of the present invention, the first inorganic particles form the inner wall surface of the opening. And the shapes of the first inorganic particles are different from the shapes of the second inorganic particles embedded in the resin insulating layer. For example, the shape of the inner wall surface can be controlled by changing the shapes of the first inorganic particles. The inner wall surface is a surface in contact with the via conductor. Therefore, by controlling the shape of the inner wall surface, adhesion between the via conductor and the resin insulating layer can be increased. When the via conductor includes a seed layer, the seed layer is formed on the inner wall surface. Therefore, by controlling the shape of the inner wall surface, a thickness of the seed layer can be reduced. Variation in the thickness of the seed layer can be reduced. Widths of conductor circuits in the second conductor layer can be close to target values. A high-quality printed wiring board can be provided.

The inner wall surface of the opening includes the first inorganic particles. Therefore, even when the second portion is thinner than the first portion, the seed layer is unlikely to peel off from the inner wall.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer formed on the first conductor layer and having an opening;
a second conductor layer formed on a surface of the resin insulating layer and comprising a seed layer and an electrolytic plating layer formed on the seed layer; and
a via conductor formed in the opening of the resin insulating layer and comprising the seed layer and the electrolytic plating layer formed on the seed layer such that the via conductor is connecting the first conductor layer and the second conductor layer,
wherein the seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and a thickness of the third portion, the resin insulating layer includes resin and inorganic particles such that the inorganic particles comprising first inorganic particles forming the inner wall surface and second inorganic particles embedded in the resin insulating layer and that the first inorganic particles have shapes that are different from shapes of the second inorganic particles, and the seed layer includes a first layer and a second layer formed on the first layer such that the first layer in the first portion of the seed layer has a thickness that is greater than a thickness of the first layer in the second portion of the seed layer and a thickness of the first layer in the third portion of the seed layer and that a thickness of the second layer in the first portion of the seed layer is greater than a thickness of the second layer in the second portion of the seed layer and a thickness of the second layer in the third portion of the seed layer.

2. The printed wiring board according to claim 1, wherein the seed layer is formed such that a thickness of the third portion formed on the portion of the first conductor layer exposed by the opening of the resin insulating layer is greater than a thickness of the second portion formed on the inner wall surface in the opening of the resin insulating layer.

3. The printed wiring board according to claim 2, wherein the seed layer is formed such that a ratio of the thickness of the second portion to the thickness of the first portion is in a range of 0.2 to 0.6 and that a ratio of the thickness of the third portion to the thickness of the first portion is in a range of 0.5 to 0.9.

4. The printed wiring board according to claim 2, wherein the resin insulating layer is formed such that the inner wall surface has an arithmetic mean roughness of 1.0 μm or less.

5. The printed wiring board according to claim 1, wherein the seed layer is formed such that the thickness of the first layer in the third portion of the seed layer is greater than the thickness of the first layer in the second portion of the seed layer and that the thickness of the second layer in the third portion of the seed layer is greater than the thickness of the second layer in the second portion of the seed layer.

6. The printed wiring board according to claim 5, wherein the seed layer is formed such that the first layer includes a copper alloy layer and that the second layer includes a copper layer.

7. The printed wiring board according to claim 6, wherein the copper alloy has a copper content of 90% or more in wt %.

8. The printed wiring board according to claim 5, wherein the resin insulating layer is formed such that the inner wall surface has an arithmetic mean roughness of 1.0 μm or less.

9. The printed wiring board according to claim 1, wherein the seed layer is formed such that a ratio of the thickness of the second portion to the thickness of the first portion is in a range of 0.2 to 0.6 and that a ratio of the thickness of the third portion to the thickness of the first portion is in a range of 0.5 to 0.9.

10. The printed wiring board according to claim 9, wherein the resin insulating layer is formed such that the inner wall surface has an arithmetic mean roughness of 1.0 μm or less.

11. The printed wiring board according to claim 1, wherein the seed layer is formed by sputtering.

12. The printed wiring board according to claim 1, wherein the seed layer is formed such that the first layer includes a copper alloy layer and that the second layer includes a copper layer.

13. The printed wiring board according to claim 12, wherein the copper alloy has a copper content of 90% or more in wt %.

14. The printed wiring board according to claim 1, wherein the resin insulating layer is formed such that the inner wall surface has the resin and the first inorganic particles having flat parts forming the inner wall surface.

15. The printed wiring board according to claim 14, wherein the resin insulating layer is formed such that the inner wall surface is consisting of the resin and the flat parts of the first inorganic particles.

16. The printed wiring board according to claim 14, wherein the resin insulating layer is formed such that each of the second inorganic particles has a spherical shape.

17. The printed wiring board according to claim 14, wherein the resin insulating layer is formed such that each of the first inorganic particles has a shape formed by cutting a sphere with a plane.

18. The printed wiring board according to claim 17, wherein the resin insulating layer is formed such that each of the first inorganic particles has a shape formed by cutting one of the second inorganic particles with a plane.

19. The printed wiring board according to claim 1, wherein the resin insulating layer is formed such that the inner wall surface has an arithmetic mean roughness of 1.0 μm or less.

20. A method for manufacturing a printed wiring board, comprising:
forming an opening in a resin insulating layer formed on a first conductor layer such that the opening exposes a portion of the first conductor layer;
forming, on a surface of the resin insulating layer, a second conductor layer comprising a seed layer and an electrolytic plating layer formed on the seed layer; and
forming, in the opening of the resin insulating layer, a via conductor comprising the seed layer and the electrolytic plating layer formed on the seed layer such that the via conductor is connecting the first conductor layer and the second conductor layer,
wherein the seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and a thickness of the third portion, the resin insulating layer includes resin and inorganic particles such that the inorganic particles comprising first inorganic particles forming the inner wall surface and second inorganic particles embedded in the resin insulating layer and that the first inorganic particles have shapes that are different from shapes of the second inorganic particles, the forming of the opening includes forming a group of the second inorganic particles having protruding portions protruding from the inner wall surface in the opening of the resin insulating layer, and removing the protruding portions in the group of the second inorganic particles such that exposed surfaces of the first inorganic particles are formed on the inner wall surface of the resin insulating layer, and the forming of the second conductor layer and the forming of the via conductor includes forming the seed layer including a first layer and a second layer formed on the first layer such that the first layer in the first portion of the seed layer has a thickness that is greater than a thickness of the first layer in the second portion of the seed layer and a thickness of the first layer in the third portion of the seed layer and that a thickness of the second layer in the first portion of the seed layer is greater than a thickness of the second layer in the second portion of the seed layer and a thickness of the second layer in the third portion of the seed layer.

\* \* \* \* \*